United States Patent [19]
Kennedy et al.

[11] Patent Number: 5,408,685
[45] Date of Patent: Apr. 18, 1995

[54] MULTIPATH DETECTOR USING PHASE COMPARISON OF STEREO PILOT SIGNAL

[75] Inventors: John F. Kennedy, Garden City; Robert D. Plowdrey, Livonia, both of Mich.

[73] Assignee: Ford Motor Company, Dearborn, Mich.

[21] Appl. No.: 863,996

[22] Filed: Apr. 6, 1992

[51] Int. Cl.$^6$ .............................................. H04B 15/00
[52] U.S. Cl. ........................................ 455/65; 455/296; 455/312; 381/13
[58] Field of Search ................. 381/13, 4; 331/20, 25; 455/65, 296, 297, 72, 73, 67.6, 214, 215, 263, 304, 312, 317, 336, 295

[56] References Cited

U.S. PATENT DOCUMENTS

| | | | |
|---|---|---|---|
| 3,537,008 | 10/1970 | Lakatos | 325/65 |
| 3,825,697 | 7/1974 | Cornell et al. | 381/4 |
| 4,246,441 | 1/1981 | Sugai et al. | 381/13 |
| 4,521,918 | 6/1985 | Challen | 455/73 |
| 4,590,615 | 5/1986 | Ohtaki et al. | 455/304 |
| 4,694,500 | 9/1987 | Tazaki et al. | 381/10 |
| 4,821,322 | 4/1989 | Bose | 381/13 |
| 4,852,167 | 7/1989 | Usui et al. | 381/13 |
| 4,878,252 | 10/1989 | Sessink | 455/276 |
| 4,881,274 | 11/1989 | Tazaki et al. | 381/13 |
| 4,910,799 | 3/1990 | Takayama | 455/296 |
| 5,046,129 | 9/1991 | Short | 455/72 |
| 5,222,252 | 6/1993 | Kässer | 455/67.3 |
| 5,241,687 | 8/1993 | Short | 455/180.3 |
| 5,249,233 | 9/1993 | Kennedy et al. | 455/65 |

*Primary Examiner*—Reinhard J. Eisenzopf
*Assistant Examiner*—Nguyen Vo

[57] ABSTRACT

A frequency modulation (FM) stereo broadcast receiver detects the onset of multipath interference based on phase changes in the received stereo pilot signal. In a preferred embodiment, the phase of the received pilot signal is compared to the phase of a regenerated pilot from a phase-locked loop in a stereo decoder circuit. The severity of a multipath event is determined by the phase shift detected at the onset of the multipath event.

8 Claims, 4 Drawing Sheets

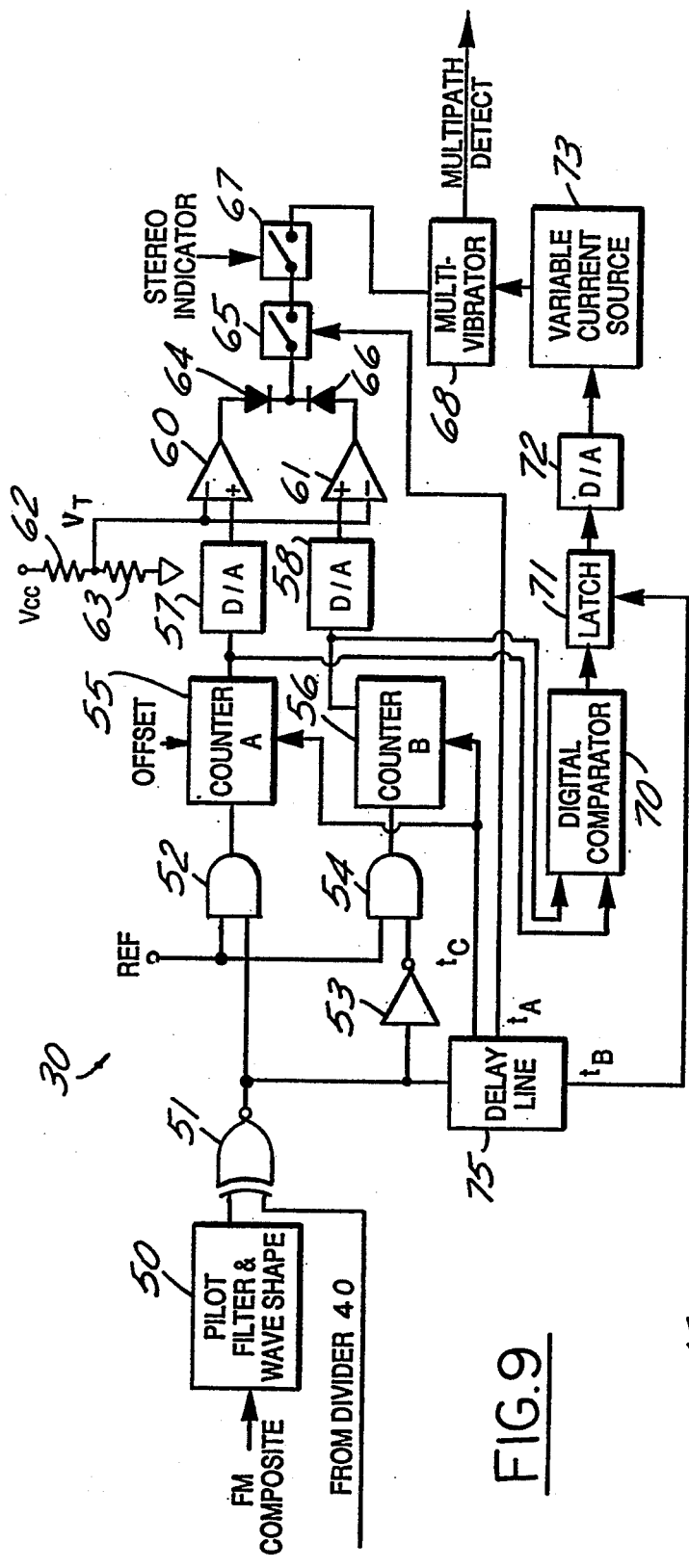
FIG.9
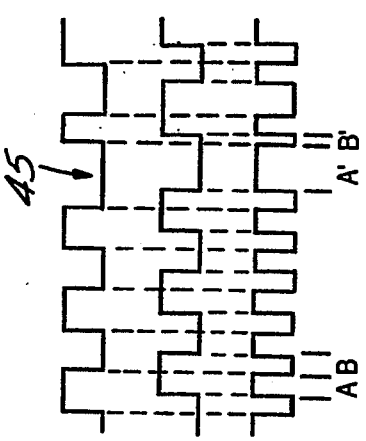
FIG.6
FIG.7
FIG.8

MULTIPATH DETECTOR USING PHASE COMPARISON OF STEREO PILOT SIGNAL

CROSS REFERENCE TO RELATED APPLICATION

This application is related to commonly assigned U.S. application Ser. No. 07/863,665, entitled "MULTIPATH NOISE MINIMIZER FOR RADIO RECEIVER", filed concurrently herewith and incorporated herein by reference.

BACKGROUND OF THE INVENTION

The present invention relates in general to radio receivers with reduced distortion during multipath events, and more specifically to fast detection of a multipath event in an FM stereo receiver.

The problem of multipath distortion in radio receivers is well known. Multipath occurs when radio frequency (RF) signals following direct and indirect (i.e. reflected) paths from a transmitter to a receiver interfere with each other at the receiver. Reflections can be caused by hills and buildings, for example.

Constructive and destructive interference of signals caused by interaction between the reflections and the direct line of sight transmission causes both signal distortion and rapid fluctuations in the received field intensity, especially in moving vehicles.

Multipath is a particularly annoying problem in reception of FM stereo broadcasts. A standard FM stereo signal includes a 19 kHz pilot carrier which is transmitted for the purpose of recovering the L-R frequency-multiplexed stereo signal. When a multipath event occurs, the FM carrier signal experiences an impulse phase shift. The phase shifted FM signal is applied to the input of an RF mixer in the typical superheterodyne receiver. Due to the nonlinear characteristics of the mixer, the phase distortion is intensified and the duration of the phase disturbance is lengthened. The phase disturbance continues to lengthen in each succeeding section of the receiver. Demodulation of the FM signal produces a phase-shifted pilot signal which is then applied to the stereo decoder. The phase shift causes an abrupt unlocking of the phase-locked loop (PLL) normally employed in the stereo decoder to regenerate the pilot carrier. A rasping sound is heard in the audio output when the PLL is violently pulled out of lock by the multipath interference.

Prior art radio receivers are known wherein stereo separation is decreased during a multipath event in order to reduce the objectionable sounds associated with multipath. However, stereo separation cannot be changed fast enough to suppress all the multipath distortion. Furthermore, changing the stereo separation is itself a type of undesirable distortion. In addition, changing the stereo separation fails to correct for the lengthening of the multipath disturbance in each section of the receiver.

There are several prior art methods for detecting the presence of multipath interference in a received broadcast signal. For example, it is known to detect multipath by measuring fluctuations in the received signal strength of the IF signal. This has been done by AM detection of a voltage signal which is proportional to received signal strength. Alternatively, multipath events can be detected by measuring particular noise components in the demodulated FM signal. However, these methods detect multipath only after the multipath has been present for an undesirably long time, allowing much distortion to reach the audible output.

SUMMARY OF THE INVENTION

It is a principal object of the present invention to minimize multipath disturbances in a radio receiver.

It is a further object of the present invention to provide a multipath detector with a short response time, so that actions to minimize audible distortion can be taken immediately upon the onset of a multipath event.

It is another object of the invention to determine both the onset and the severity of a multipath event.

These and other objects are achieved in the present invention wherein a pilot signal, such as the 19 kHz stereo pilot signal used in FM stereo broadcasting, is examined to detect phase shifts associated with a multipath event. In particular, the pilot signal can be applied to a phase-locked loop to produce a regenerated pilot signal in quadrature with the pilot signal. The relative phase between the pilot signal and the quadrature regenerated pilot signal is measured. When the relative phase differs from 90° by a phase error greater than a predetermined phase, then a multipath event is detected. The severity of a multipath event is defined as the magnitude of the phase error.

BRIEF DESCRIPTION OF THE DRAWINGS

The novel features of the invention are set forth with particularity in the appended claims. The invention itself, however, both as to its organization and method of operation together with further objects and advantages thereof, may best be understood by reference to the following description taken in conjunction with the accompanying drawings in which:

FIG. 6 is a waveform diagram showing a pilot signal after wave-shaping.

FIG. 7 is a waveform diagram showing a quadrature regenerated pilot signal.

FIG. 8 is a waveform diagram showing an exclusive NOR function of the waveforms of FIGS. 6 and 7.

FIG. 9 is a schematic diagram of a preferred multipath detector according to the present invention.

DETAILED DESCRIPTION OF PREFERRED EMBODIMENTS

Figure 1:
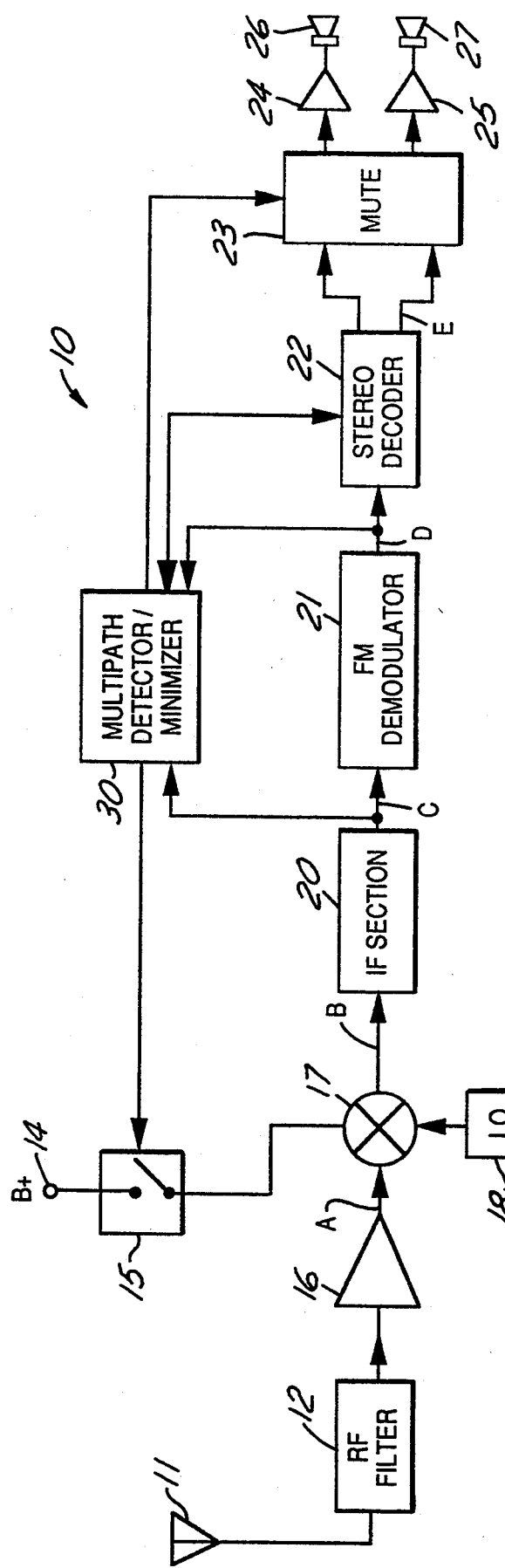
FIG. 1 is a block diagram showing an FM stereo receiver according to the present invention.

FIG. 1 shows an FM stereo receiver 10 including an antenna 11 for receiving RF signals which may at times be subject to changing multipath interference, e.g., in an automobile. RF signals from antenna 11 are coupled through an RF filter 12 to an RF amplifier 16. Amplified RF signals from amplifier 16 are coupled to one input of a mixer 17. A power supply voltage B+ is supplied at a terminal 14 and through a power switch 15 to RF mixer 17 when power switch 15 is closed. A mixing signal is provided from a local oscillator 18 to another input of mixer 17.

The output of mixer 17 is provided to an IF section 20 for providing IF filtering and amplification to produce an IF signal. An FM demodulator 21 demodulates the IF signal from IF section 20 to produce a baseband signal.

If the received broadcast is an FM stereo broadcast, then the demodulated signal includes a baseband stereo sum channel, a 19 kHz pilot signal, and stereo difference channels modulated on a suppressed 38 kHz subcarrier. These are all input to stereo decoder 22 which generates left and right stereo signals which are coupled through a mute circuit 23 to amplifiers 24 and 25 and speakers 26 and 27.

Receiver 10 further includes a multipath detector/minimizer 30 for sensing the onset of multipath distortion. Multipath conditions are detectable based on the IF signal and/or the demodulated FM signal, as shown. However, a preferred technique based on comparing the stereo pilot signal from the FM demodulator with a regenerated pilot signal from the stereo decoder will be described below with reference to FIGS. 6–11. In the preferred embodiment, multipath detector/minimizer 30 receives input signals only from FM demodulator 21 and stereo decoder 22.

Minimizer 30 is connected to power switch 15 so as to remove power from RF mixer 17 during a multipath event. When power switch 15 is opened, the RF mixer output is quickly disabled and the phase distortion accompanying the multipath event is stopped at the mixer output. In a preferred embodiment, the length of time that the mixer is disabled is determined by the severity of the multipath event, e.g., the magnitude of the phase shift in the multipath event. The time during which the RF mixer is disabled must have a duration less than about 5 milliseconds to avoid audible distortion.

Minimizer 30 is also connected to stereo decoder 22 for controlling the time constant of the stereo decoder phase-locked loop. In the absence of multipath, the time constant of the phase-locked loop has a conventional value allowing the phase-locked loop to maintain lock on the stereo pilot signal. Upon the occurrence of multipath, the time constant is lengthened to maintain a stable (i.e. latched) output in the phase-locked loop. With the PLL latched, the regenerated pilot signal used in the stereo decoder maintains a fixed phase and frequency and is substantially unaffected by the multipath-induced impulse phase shift of the stereo pilot signal. Preferably, the phase-locked loop is latched during the same time period when the RF mixer is disabled. If the multipath event has ended by the time that the phase-locked loop is unlatched, then the phase-locked loop output should be substantially in phase with the multipath-free stereo pilot signal and the phase-locked loop will maintain lock. Thus, abrupt changes in the phase-locked loop output signal, which would cause the undesirable rasping sound heard at the speaker output, are avoided.

Minimizer 30 may be further coupled to a mute circuit 23 to provide audio blanking during the multipath disturbance. Power switch 15, stereo decoder 22, and mute circuit 23 are preferably all controlled by a single Multipath Detect Signal from minimizer 30.

Figure 2:
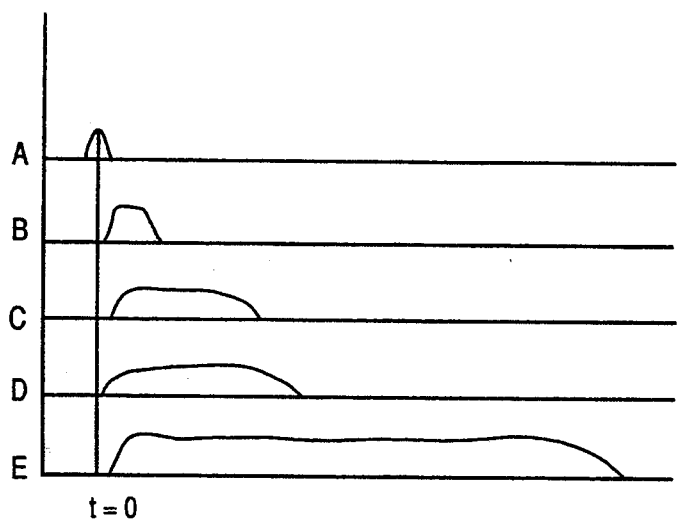
FIG. 2 shows propagation of a multipath disturbance as occurs in a prior art receiver without the corrective actions of the present invention.

FIG. 2 illustrates the lengthening of a multipath disturbance in a prior art receiver. Curves A–E in FIG. 2 show the magnitude of the phase disturbance at points A–E of FIG. 1 which would occur without minimizer 30. An impulse phase shift in the stereo pilot signal occurs at point A (the input to the RF mixer). Curves B, C, D and E show the increased duration of the phase disturbance at points B, C, D, and E of FIG. 1 which would occur in a prior art receiver.

Figure 3:
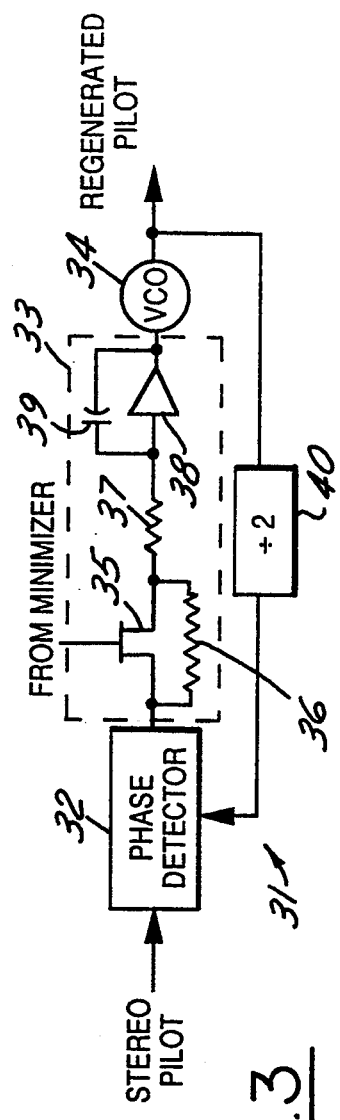
FIG. 3 is a schematic diagram showing an improved phase-locked loop according to the present invention.

FIG. 3 illustrates a phase-locked loop (PLL) 31 contained in stereo decoder 22 to provide a regenerated pilot for purposes of demodulating the stereo difference channel. Use of a regenerated pilot signal is conventional in stereo decoders. The received 19 kHz stereo pilot signal is provided to a phase detector 32. The output of phase detector 32 is connected to a loop filter 33 having its output connected to the input of a voltage controlled oscillator (VCO) 34. The output of VCO 34 comprises a 38 kHz regenerated pilot signal used to demodulate the stereo difference channel. The regenerated pilot signal is also connected back to a second input of phase detector 32 through a divide-by-2 circuit 40. The output of divide-by-2 circuit 40 is a 19 kHz signal that is in quadrature (i.e., phase shifted by 90°) with respect to the stereo pilot signal.

Loop filter 33 is specially adapted to provide a switchable time constant for purposes of latching PLL 31 at a long time constant in response to the Multipath Detect Signal. Thus, a field-effect transistor (FET) 35 has its gate connected to receive the Multipath Detect Signal from minimizer 30. The source and drain of FET 35 are connected to respective ends of a resistor 36. The parallel combination of FET 35 and resistor 36 is connected in series with a resistor 37 between the output of phase detector 32 and the input of an operational amplifier (op amp) 38. A capacitor 39 is connected between the input and output of op amp 38. The output of op amp 38 is connected to the input of VCO 34.

The Multipath Detect Signal employs negative logic signals so that FET 35 is rendered conductive in the absence of multipath and resistor 36 does not affect the time-constant. Loop filter 33 acts as a proportional-integral controller providing a time constant determined by resistor 37 and capacitor 39 as is conventional in the art. In the presence of multipath, however, FET 35 is rendered nonconductive thereby adding the resistance of resistor 36 to the time constant circuit. Resistor 36 has a high resistance and causes the phase-locked loop to be latched with a long time constant so that the regenerated pilot is temporarily fixed in phase and frequency.

Figure 4:
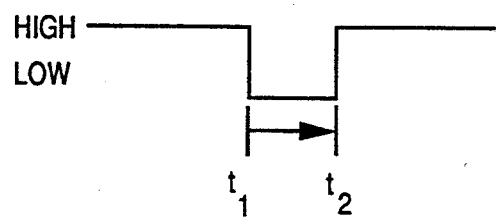
FIG. 4 shows the multipath control signal of the present invention.

FET 35 is preferably an enhancement-mode device which is rendered conductive in response to a positive voltage from minimizer 30. FIG. 4 shows the Multipath Detect Signal wherein a high logic level voltage indicates a normal condition and a low logic level voltage indicates a multipath event. A multipath event is detected at $t_1$ and the low Multipath Detect Signal has a duration from $t_1$ to $t_2$.

The duration of the low Multipath Detect Signal (i.e., the time during which corrective action is taken in the receiver) is determined by the severity of the multipath event. In the preferred embodiment, the severity of a multipath event is determined by the phase magnitude of the phase shift detected in the stereo pilot signal.

Figure 5:
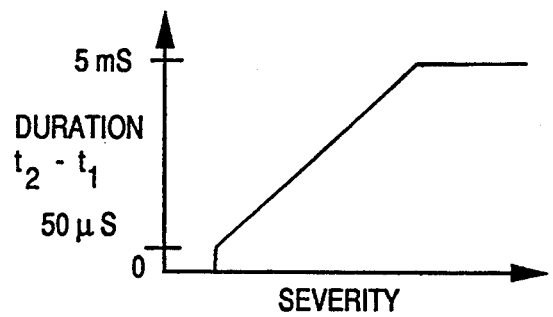
FIG. 5 plots a preferred control curve for the duration of the multipath control signal in dependence on multipath severity.

FIG. 5 plots the duration of a low Multipath Detect Signal against the severity of the multipath event. At less than a predetermined level of severity, no corrective action is taken. At a threshold level of severity, a multipath detect signal having a minimum duration of about 50 microseconds is produced by the multipath detector/minimizer. With increasing severity of the multipath event, an increasing duration is employed up to a maximum duration of 5 milliseconds. Any muting or disabling of the RF mixer extending for longer than 5 milliseconds would create objectionable noise in the output of the receiver.

In order to successfully minimize the multipath distortion evident in the audio output of a receiver, the present invention employs a novel technique for quickly detecting the onset of a multipath event. This technique relies on monitoring a phase shift in a pilot (i.e., substantially fixed frequency) signal. For example, a composite signal comprising the pilot signal together with the transmitted broadcast information (i.e., audio signal) is passed through a bandpass filter to isolate the pilot signal. The bandpass filter output is a sinusoidal pilot signal which is then applied to a wave shaper to generate a square wave signal with a fifty percent duty cycle, resulting in the waveform of FIG. 6. A 19 kHz regenerated pilot signal that is obtained at the input to the phase detector of the phase lock loop is shown in FIG. 7. An exclusive NOR function is applied to the signals of FIGS. 6 and 7 resulting in the logic signal shown in FIG. 8 which has a high logic level when the signals of FIGS. 6 and 7 are equal and has a low logic level when they are unequal.

The logic signal in FIG. 8 is indicative of the phase relationship between the broadcast stereo pilot and the regenerated pilot. When the broadcast pilot and the regenerated pilot are exactly in quadrature (i.e., there is no phase disturbance), the logic signal of FIG. 8 will be a 38 kHz square wave with a fifty percent duty cycle. A counting window "A" and a counting window "B" are defined when the logic signal is high and low, respectively. When there is no phase disturbance, the durations of counting windows A and B are substantially equal and are both within a predetermined range.

With the onset of a multipath event, the broadcast stereo pilot signal in FIG. 6 experiences a phase shift as shown at 45. The phase shift in the stereo pilot is then apparent from a longer than normal duration of counting window A' and a shorter than normal duration of counting window B'. These abnormal durations are indicative of a multipath event and the actual difference between the abnormal duration and a normal duration is indicative of the severity of the multipath event. The abnormality can be detected by monitoring either the excess duration of a counting window or the insufficient duration of a counting window.

FIG. 9 shows a preferred embodiment of multipath detector/minimizer 30 in greater detail. An FM composite signal including the stereo channels and the 19 kHz stereo pilot are provided to pilot filter and wave shaper 50. The filtered and wave-shaped pilot signal is provided to one input of an exclusive NOR gate 51. The 19 kHz output signal from divide-by-2 circuit 40 (FIG. 3) is coupled to the other input of exclusive NOR gate 51. The regenerated 19 kHz pilot may typically be a square wave; but in the event that the stereo decoder employs a sinusoidal regenerated pilot signal, then an additional wave shaper would be required.

The output of exclusive NOR gate 51 is connected to an input of AND gate 52 and an input of inverter 53. The output of inverter 53 is connected to an input of AND gate 54. AND gates 52 and 54 each have an input connected to receive a reference signal REF which has a fixed frequency which is very much higher in frequency than the frequency of the stereo pilot signal (e.g., 4 MHz). The output of AND gate 52 is comprised of a train of pulses at the reference frequency during counting window A which are counted by a counter 55. The output of AND gate 54 stays low during counting window A. During Counting window B, the output of AND gate 52 stays low and the output of AND gate 54 is comprised of pulses at the reference frequency which are counted by a counter 56. Thus, the magnitude of the counts reached in counters 55 and 56 correspond to the durations of counting window A and counting window B, respectively.

The outputs of counters 55 and 56 are connected to digital-to-analog (D/A) converters 57 and 58, respectively. The output of D/A converter 57 is connected to the noninverting input of a comparator 60, and the output of D/A converter 58 is connected to the noninverting input of a comparator 61. The inverting inputs of comparators 60 and 61 receive a threshold voltage $V_T$ from a voltage divider comprised of resistors 62 and 63 connected in series between a supply voltage $V_{CC}$ and ground. Threshold voltage $V_T$ has a magnitude corresponding to a count which indicates a multipath event severe enough to employ corrective action.

The output of comparator 60 is coupled to the input of a sampling switch 65 through a diode 64. The output of comparator 61 is coupled to the input of sampling switch 65 through a diode 66. The output of sampling switch 65 is connected to the input of a stereo indicator switch 67. The output of stereo indicator switch 67 is connected to the trigger input of a multivibrator 68. The output of multivibrator 68 comprises the Multipath Detect Signal which controls corrective action in the receiver.

The outputs of counters 55 and 56 are also connected to respective inputs of a digital comparator 70. The largest digital value at the input to comparator 70 is provided via its output to the input of a latch 71. The count in latch 71 is coupled to a D/A converter 72 having its output connected to a variable current source 73. Variable current source 73 provides power to multivibrator 68.

A delay line 75 is connected to the output of exclusive NOR gate 51 and provides timing signals to counters 55 and 56, sampling switch 65 and latch 71.

In operation, counters 55 and 56 accumulate counts indicative of the duration of counting windows A and B, respectively. These counts are converted to analog voltages for comparison with the threshold voltage $V_T$. If either count is above the threshold, then a high voltage is coupled through either diode 64 or 66 to sampling switch 65. Delay line 75 is triggered by the end of counting window B (i.e., a positive transition in the output of exclusive NOR gate 51). At a time $t_A$ after the end of counting window B, delay line 75 sends a sampling signal to sampling switch 65. If the output of either comparator is high during the sampling time, a high level signal is coupled to the input of stereo indicator switch 67. If a stereo signal is being received (as determined by the detected presence of the pilot signal), then switch 67 will be closed and the high level signal will be coupled to multivibrator 68 which is triggered and generates the Multipath Detect Signal. Stereo indicator switch 67 prevents erroneous operation of multipath detector/minimizer 30 when no stereo signal is present.

The duration of the Multipath Detect Signal is controlled by variable current source 73. Thus, delay line 75 controls latch 71 at a time $t_B$ (which occurs just after time $t_A$) in order to latch the largest count from counters 55 and 56. This largest count is converted to an analog voltage in D/A converter 72 and controls the magnitude of current supplied by variable current source 73 to multivibrator 68 between upper and lower current limits. The analog voltage from the D/A converters 72 is directly proportional to the magnitude of the phase shift which has been detected (i.e., proportional to the severity of the multipath event). The magnitude of current supplied by variable current source 73 is inversely proportional to the analog voltage from D/A converters 72. The duration of a pulse from multivibrator 68 is proportional to the current supplied by variable current source 73. Thus, the greater the severity of a multipath event, the longer the duration of the Multipath Detect Signal (i.e., the duration of a negative logic pulse from multivibrator 68).

At a time $t_C$ just after time $t_B$, delay line 75 generates a signal which resets counters 55 and 56. Depending on the speed of the circuit elements employed (e.g., the time required for digital-to-analog conversions and the settling time for various voltages), counter 55 may have already received one or more reference pulses through an AND gate 52 in the next counting cycle of counting window A. However, since time delay $t_C$ and the period of reference signal REF are constant, counter 55 is preloaded when it is reset with an offset count equal to the time period $t_C$ divided by the period of reference signal REF.

Figure 10:
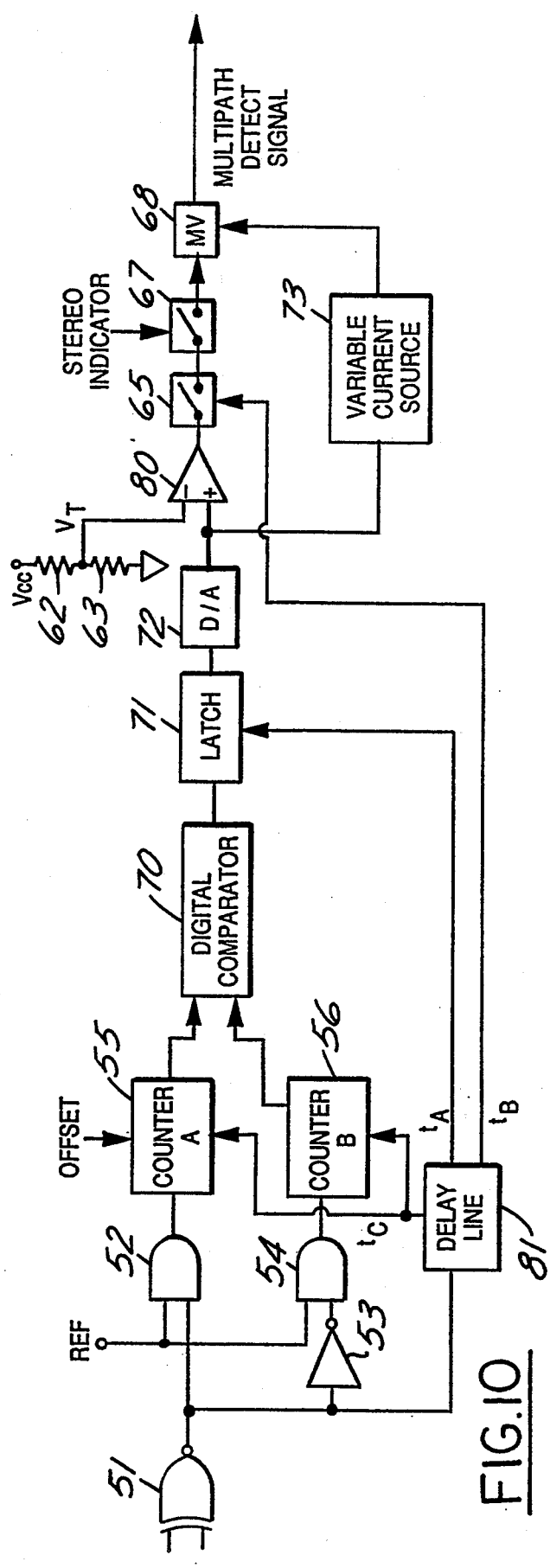
FIG. 10 is an alternative embodiment of the multipath detector using fewer components.

FIG. 10 show an alternative embodiment using fewer components but requiring additional time to generate the Multipath Detect Signal. In this embodiment, the output from D/A converter 72 (which corresponds to the larger of the two counts) provides severity information through variable current source 73, as in the previous embodiment, and is also compared to threshold $V_T$ in a comparator 80. This eliminates two D/A converters and one comparator from the circuit. However, digital comparator 70 and latch 71 insert an additional delay in the initiation of a Multipath Detect Signal by comparator 80. Nevertheless, the onset of a multipath event is detected more quickly than in the prior art.

Figure 11:
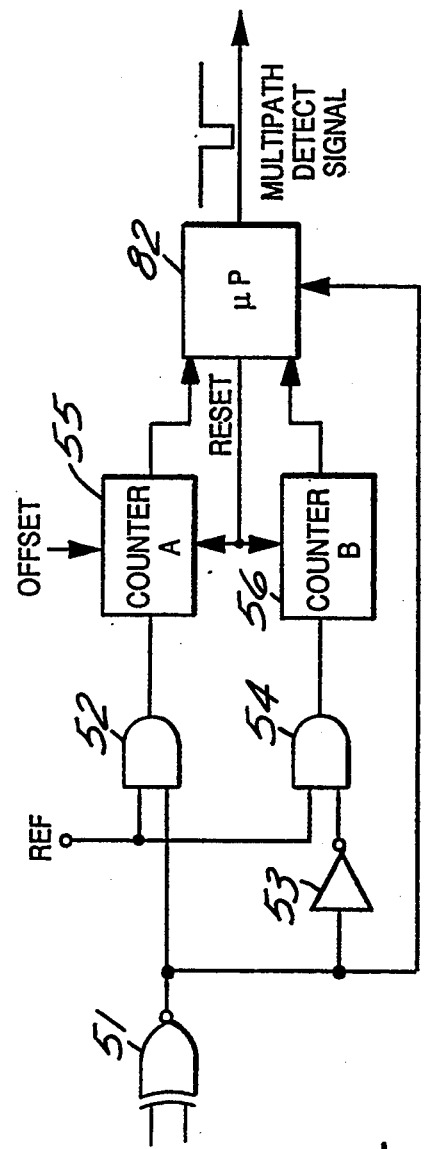
FIG. 11 is an alternative embodiment of the multipath detector using a microprocessor.

A further embodiment in FIG. 11 employs a microprocessor 82 to receive the counts from counters 55 and 56. Microprocessor 82 also receives an output signal from exclusive NOR gate 51. Upon a transition of the exclusive NOR gate signal, microprocessor 82 reads the counts from counters 55 and 56 and then resets them. Based on the count values (e.g., by comparing them to stored digital constants), microprocessor 82 generates the appropriate Multipath Detect Signal.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. Apparatus for detecting multipath in a received radio signal comprising:
   stereo pilot means for isolating a stereo pilot signal from said received radio signal;
   phase-locked loop means coupled to said stereo pilot means for producing a regenerated pilot signal in quadrature with said stereo pilot signal;
   window means for determining first and second phase windows each having a duration fixed by transitions in said stereo pilot signal and said regenerated pilot signal; and
   multipath means for generating a multipath signal when one of said first or second phase windows has a duration outside a predetermined range of duration.

2. The apparatus of claim 1 wherein said multipath means generates said multipath signal if one of said first or second phase window durations is greater than a predetermined duration.

3. The apparatus of claim 2 wherein said multipath means comprises:
   first counting means for counting at a predetermined frequency during said first phase window to derive a first count;
   second counting means for counting at said predetermined frequency during said second-phase window to derive a second count; and
   comparison means for indicating whether either of said first or second counts is greater than a predetermined count.

4. The apparatus of claim 1 further comprising:
   phase intensity means for indicating a severity of a multipath event in proportion to the duration of the longer of said first and second phase windows.

5. A radio receiver with reduced multipath distortion comprising:
   RF mixer means for generating an intermediate frequency (IF) signal;
   switchable power means for selectably providing power to said RF mixer means;
   stereo pilot means for isolating a stereo pilot signal from said IF signal;
   phase-locked loop means coupled to said stereo pilot means for producing a regenerated pilot signal in quadrature with said stereo pilot signal;
   window means for determining first and second phase windows each having a duration fixed by transitions in said stereo pilot signal and said regenerated pilot signal;
   multipath means for generating a multipath signal when one of said first or second phase windows has a duration outside a predetermined range of duration; and
   control means for momentarily causing said switchable power means to remove power from said RF mixer means in response to said multipath signal.

6. The receiver of claim 5 further comprising phase intensity means for indicating a severity of a multipath event in proportion to the duration of the longer of said first and second phase windows, and wherein said control means removes power from said RF mixer means for a time period corresponding to said indicated severity.

7. A radio receiver with reduced multipath distortion comprising:
   RF mixer means for generating an intermediate frequency (IF) signal;
   stereo pilot means for isolating a stereo pilot signal from said IF signal;
   phase-locked loop means coupled to said stereo pilot means for producing a regenerated pilot signal in quadrature with said stereo pilot signal, said phase-locked loop means having a switchable time constant so that said phase-locked loop means is latched with a long time constant in response to a multipath signal;

window means for determining first and second phase windows each having a duration fixed by transitions in said stereo pilot signal and said regenerated pilot signal; and multipath means for generating said multipath signal when one of said first or second phase windows has a duration outside a predetermined range of duration.

8. The receiver of claim 7 further comprising phase intensity means for indicating the severity of a multipath event in proportion to the duration of the longer of said first and second phase windows, and wherein said multipath signal has a time period corresponding to said indicated severity.

* * * * *